United States Patent [19]

Cohen et al.

[11] 4,139,658

[45] Feb. 13, 1979

[54] PROCESS FOR MANUFACTURING A RADIATION HARDENED OXIDE

[75] Inventors: Seymour H. Cohen, Berkeley Heights; Joseph J. Fabula, Somerville, both of N.J.

[73] Assignee: RCA Corp., New York, N.Y.

[21] Appl. No.: 698,924

[22] Filed: Jun. 23, 1976

[51] Int. Cl.$^2$ ............................................. B05D 5/12
[52] U.S. Cl. ..................................... 427/93; 427/255; 148/1.5; 357/54; 29/576 R
[58] Field of Search ................... 427/93, 255, 399, 94; 428/446; 357/54; 148/1.5

[56] References Cited

U.S. PATENT DOCUMENTS

| Re. 28,385 | 4/1975 | Mayer | 427/93 |
|---|---|---|---|
| 3,258,359 | 6/1966 | Hugle | 427/93 |
| 3,336,661 | 8/1967 | Polinsky | 29/589 |
| 3,666,546 | 5/1972 | Reuter et al. | 427/93 |
| 3,692,571 | 9/1972 | Colton et al. | 427/93 |
| 4,010,290 | 3/1977 | Boland | 427/93 |

OTHER PUBLICATIONS

Deal, *Oxidaton of Silicon in Dry Oxygen, Wet Oxygen and Steam*, Journ. of Electrochemical Society 6/63, pp. 527–533, vol. 10, No. 6.

*Primary Examiner*—John T. Goolkasian
*Attorney, Agent, or Firm*—H. Christoffersen; R. P. Williams; Sanford J. Asman

[57] ABSTRACT

A pyrogenic oxide is grown on a silicon wafer in a furnace by oxidizing hydrogen in the presence of an excess amount of oxygen as well as anhydrous hydrogen chloride to produce steam within the furnace. After growing a suitable pyrogenic oxide layer, the hydrogen and hydrogen chloride flows are turned off while the oxygen flow is continued to grow a dry oxide. A nitrogen anneal while the wafer is slowly pulled from the furnace completes the hybrid, radiation hard oxide layer.

14 Claims, No Drawings

PROCESS FOR MANUFACTURING A RADIATION HARDENED OXIDE

The subject matter described in the present application is related to the subject matter described in U.S. patent application Ser. No. 648,455 filed Jan. 12, 1976 (RCA 69,761) and was invented by the same inventors and is assigned to the same assignee.

The present invention relates to a process for producing a radiation hardened silicon oxide layer for use in semiconductor devices. In particular, the invention relates to a process for producing silicon dioxide gate insulators capable of withstanding large total doses of radiation without suffering a large degradation of electrical qualities.

Radiation hardness is a measure of a material's ability to withstand a total dose of radiation before its qualities have degraded beyond some acceptable level. Absorbed radiation doses are measured in "rads," a "rad" being the unit of abosorbed radiation dose required to impart 100 ergs of energy to one gram of a material. Inasmuch as silicon is the material of interest with regard to the present invention, the appropriate unit of total absorbed radiation dose is "rads (Si)," the amount of radiation necessary to impart 100 ergs of energy into one gram of silicon. The term "radiation hardness" as used herein refers to the insensitivity of an oxide to degradation in electrical characteristics caused by radiation. As all oxides are degraded in their electrical qualities by radiation, the radiation hardness of a particular oxide will be considered to be the total radiation does the oxide can absorb before a defined electrical characteristic varies by more than some predetermined value from a pre-irradiation value. In particular, metal-oxide-semiconductor (MOS) capacitor structures formed with oxide dielectrics may be tested for radiation hardness by measuring the total absorbed radiation dose required to vary their flatband voltage by a fixed amount from their pre-irradiated value.

Considerable effort has been devoted in the past toward improving the tolerance of MOS devices to radiation. Much of the effort has been devoted toward using alternative material for gate insulators, and while numerous esoteric techniques and materials have been discussed in the literature, none of the prior art oxides proved capable of combining high radiation tolerance with stable, reliable devices.

In an aritcle by Kenneth G. Aubuchon entitled "Radiation Hardening of P-MOS Devices by Optimization of the Thermal $SiO_2$ Gate Insulator", IEEE Transactions on Nuclear Science, Vol. NS-18, 117-125, December 1971, attention was directed toward producing a radiation hardened thermally grown layer of silicon dioxide. It was concluded therein that silicon dioxide gate insulators could be radiation hardened to at least $10^6$ rads by producing the oxide in a dry oxygen environment at about 1000° C. Oxides produced in that manner are called "dry" oxides.

Methods of growing oxides in the presence of steam as well as in the presence of varied amounts of water vapor have been known heretofore. The known steam oxidation process involved bubbling oxygen through distilled water at a temperature of about 95° C. The wet oxide process, which makes possible continuous variations between steam oxidation and dry oxidation, is generally accomplished by bubbling oxygen through water at various temperatures between 25° C. and 95° C., using a furnace temperature of 1000° C. It has been found that oxides of silicon grow fastest when using a steam oxidation technique and slowest when using a dry oxide technique.

It is known also that gate oxides formed by using the dry oxide process are capable of withstanding a large total radiation dose, on the order of $10^6$ to $10^7$ rads (Si) without significant degradation of their electrical qualities. However, devices employing gate oxides formed by the dry oxide process have a low source to drain breakdown voltage and exhibit high leakage current. These characteristics result from the increased lateral diffusion of the drain and source diffusants caused by the higher temperature and longer growth period employed when a "dry" oxide rather than a steam oxide is grown. Accordingly, integrated circuits in which the gate oxides are made by the dry oxide process exhibit higher power consumption as a result of the higher leakage current than integrated circuits in which the gate oxide is made by the steam oxide process.

Complementary-symmetry metal-oxide-semiconductor (COS/MOS) integrated circuits possess many advantages which recommend their use in radiation-susceptible space and military environments, including ultra-low standby-power consumption, high noise immunity, high packaging density and high reliability. However, in order to avoid degradation of the beneficial electrical qualities of COS/MOS integrated circuits when employed in certain applications, a radiation hardened gate oxide is required.

The present process for manufacturing a radiation hard oxide for semiconductor devices comprises, briefly, the step of placing a clean silicon wafer into a furnace containing from 0.1% to 3.0% by volume of anhydrous hydrogen chloride. The temperature of the furnace is between 800° C. and 1000° C., and oxygen and hydrogen gases are injected therein. An oxide layer is grown in the presence of steam formed by the oxidation of the hydrogen gas in the furnace. Then the hydrogen and hydrogen chloride flows are turned off and the growth of the oxide is continued in the presence of the oxygen alone. The oxide is completed by an in-situ anneal in an inert gas, such as nitrogen.

Very pure steam may be generated within a furnace by injecting hydrogen and oxygen gases at temperatures between about 800° C. and 1000° C. Silicon dioxide, grown in a furnace in which hydrogen and oxygen are combined to produce steam in situ, will be referred to herein as "pyrogenic" oxide. A hybrid oxide, grown initially as a pyrogenic oxide with additional growth as a dry oxide, as will be explained hereinafter, has been found to exhibit exceptionally high tolerance to radiation exposure without degradation of electrical characteristics, as is the case with dry oxides.

In order to grow a radiation hardened hybrid oxide, one starts with a wafer of silicon, preferably a uniform crystal of N type silicon having a surface oriented substantially parallel to the (100) crystallographic planes in the wafer. The wafer is cleaned in a standard manner, then it is placed in a furnace boat which is inserted into a resistance heated furnace having a quartz tube wall. The furnace has flowing therethrough both hydrogen and oxygen gases as well as an anhydrous hydrogen halide gas, such as hydrogen chloride, hydrogen bromide, or hydrogen iodide, which is used to keep the oxide clean in a manner more fully described in U.S. Pat. No. Re. 28,385 entitled METHOD OF TREATING A SEMICONDUCTOR DEVICE which issued on Apr. 8, 1975 to Alfred Mayer and which is assigned to RCA Corporation. In the preferred embodiment of the present invention, the hydrogen halide which is used is hydrogen chloride.

The oxygen flow is adjusted to provide sufficient oxygen to oxidize the hydrogen gas in the system and to provide an oxidation rate of the silicon which is insensitive to the oxygen flow rate, but one in which the gas flow in the system has not yet become turbulent. Typically, an oxygen flow rate between 2 and 4 liters per minute is suitable in a 4 inch diameter furnace tube to provide adequate oxygen for oxidation of both the silicon and the hydrogen, without turbulence. The hydrogen flow is regulated by a mass flow control system capable of accurately controlling the ratio between the hydrogen and oxygen gases. The mass flow system is adjusted to inject hydrogen gas to produce steam in an oxygen rich environment. It has been found that at various temperatures the percentage of steam produced in the furnace should be maintained at between 5% and 95% by volume. The mass flow system is also used to inject ultra pure, anhydrous hydrogen chloride into the furnace and is adjusted so that between 0.1% and 3% of the volume of the furnace is occupied by the hydrogen chloride. Accordingly, between 95% and 5% of the oxygen flowing into the system remains as free oxygen which flows out of the system.

The initial oxygen flow rate for a 4 inch furnace is generally chosen to be 2 liters/minute. Together with the oxygen flow, the hydrogen and hydrogen chloride flows, each regulated as a predetermined percentage of the oxygen flow, insure that there will be no diffusion of gases into the furnace in accordance with the minimum flow rate requirement that air flow into the furnace must be prevented. The maximum oxygen flow rate is determined by the requirement that turbulence within the furnace must be prevented in order to have a uniform oxide growth.

It has been found that high quality hybrid oxides may be grown at temperatures between 800° C. and 1000° C. Those oxides grown at furnace temperatures between 850° C. and 950° C. generally have the maximum radiation hardness. The initial growth of the pyrogenic oxide should continue for at least 5 minutes in the presence of from 0.1% to 3.0% of hydrogen chloride, and typically the pyrogenic oxide is grown for approximately 45 minutes. Then, the hydrogen and hydrogen chloride flows are turned off while the oxygen flow is continued and its flow rate is increased, if necessary, to insure that there will be no diffusion of outside gases into the furnace. In particular, it has been found that an oxygen flow rate on the order of 4 liters/ minute will be adequate to prevent diffusion of gases into the furnace while providing adequate oxygen for oxidation of silicon. The growth of the silicon dioxide layer is generally continued in the pure oxygen for between 5 and 60 minutes, in order to grow a "dry" oxide layer which insures that the desired radiation hardness qualities will be present. Growth of the "dry" oxide layer for approximately 30 minutes has been found to be particularly suitable.

Following the dry oxide growth the wafer is annealed while being slowly pulled from the furnace. The anneal takes place in the presence of an inert gas which is typically nitrogen.

A series of examples of MOS capacitor structures using hybrid oxide dielectrics processed in accordance with the present invention is set forth below. In each of the following examples, the radiation hardness of the hybrid oxide manufactured is measured by the flatband voltage variation which the oxide exhibited after being exposed to a total radiation dose of $10^6$ rads (Si).

EXAMPLE I

A wafer of N type silicon having a surface crystal orientation substantially parallel to the (100) crystallographic plane is placed in a 4 inch diameter furnace heated to 925° C. through which oxygen, hydrogen choride, and hydrogen are flowing. The oxygen is injected at a rate of about 2 liters/minute. The hydrogen chloride concentration is set at 0.5% by the mass flow controller and the hydrogen flow is regulated to combine hydrogen gas with 25% of the oxygen present in the furnace to produce steam in situ. A pyrogenic oxide is grown on the wafer for 45 minutes. Then, the hydrogen and hydrogen chloride flows are turned off and the oxygen flow is continued for 30 minutes. Next, the oxygen flow is turned off and nitrogen is injected into the furnace at a rate of about 2 liters/minute. The wafer is then slowly pulled from the furnace to room temperature over a period of about 5 minutes and the radiation hardness of the oxide is tested. The flatband voltage shift after a total radiation dose of $10^6$ rads (Si) was 0.7 volts.

EXAMPLE II

A wafer of N type silicon having a surface crystal orientation substantially parallel to the (100) crystallographic plane is placed in a 4 inch diameter furnace heated to 925° C. through which oxygen, hydrogen chloride, and hydrogen are flowing. The oxygen is injected at a rate of about 2 liters/minute. The hydrogen chloride concentration is set at 1% by the mass flow controller, and the hydrogen flow is regulated to combine hydrogen gas with 25% of the oxygen gas present in the furnace to produce steam in situ. A pyrogenic oxide is grown on the wafer for 45 minutes. Then, the hydrogen and hydrogen chloride flows are turned off and the oxygen flow is continued for 30 minutes. Next, the oxygen flow is turned off and nitrogen is injected into the furnace at a rate of about 2 liters/minute. The wafer is then slowly pulled from the furnace to room temperature over a period of about 5 minutes and the radiation hardness of the oxide is tested. The flatband voltage shift, after a total radiation dose of $10^6$ rads (Si) was 1.1 volts.

EXAMPLE III

A wafer of N type silicon having a surface crystal orientation substantially parallel to the (100) crystallographic plane is placed in a 4 inch diameter furnace heated to 925° C. through which oxygen, hydrogen chloride, and hydrogen are flowing. The oxygen is injected at a rate of about 2 liters/minute. The hydrogen chloride concentration is set at 1% by the mass flow controller, and the hydrogen flow is regulated to combine hydrogen gas with 5% of the oxygen gas present in the furnace to produce steam in situ. A pyrogenic oxide is grown on the wafer for 45 minutes. Then, the hydrogen and hydrogen chloride flows are turned off and the oxygen flow is continued for 30 minutes. Next, the oxygen flow is turned off and nitrogen is injected into the furnace at a rate of about 2 liters/minute. The wafer is then slowly pulled from the furnace to room temperature over a period of about 5 minutes and the radiation hardness of the oxide is tested. The flatband voltage shift, after a total radiation dose of $10^6$ rads (Si) was 0.5 volts.

EXAMPLE IV

A wafer of N type silicon having a surface crystal orientation substantially parallel to the (100) crystallographic plane is placed in a 4 inch diameter furnace heated to 925° C. through which oxygen, hydrogen chloride, and hydrogen are flowing. The oxygen is injected at a rate of about 2 liters/minute. The hydrogen chloride concentration is set at 3% by the mass flow controller, and the hydrogen flow is regulated to combine hydrogen gas with 25% of the oxygen gas present in the furnace to produce steam in situ. A pyrogenic oxide is grown on the wafer for 45 minutes. Then, the hydrogen and hydrogen chloride flows are turned off and the oxygen flow is continued for 30 minutes. Next, the oxygen flow is turned off and nitrogen is injected into the furnace at a rate of about 2 liters/minute. The wafer is then slowly pulled from the furnace to room temperature over a period of about 5 minutes and the radiation hardness of the oxide is tested. The flatband voltage shift, after a toal radiation dose of $10^6$ rads (Si) was 3.5 volts.

In addition to the above examples which illustrate flatband voltage shifts of MOS capacitors fabricated according to the process of the present invention, an RCA COS/MOS integrated circuit type CD4023A, a triple 3-input NAND gate which is commerically available, was manufactured using the process of the present invention. In fabricating the device, a wafer of N type silicon having a crystal orientation substantially parallel to the (100) crystallographic plane was placed in a furnace heated to 925° C. into which oxygen, hydrogen chloride, and hydrogen were flowing. The oxygen was injected at a rate of about 2 liters/minute. The hydrogen chloride concentration is set at 1% by a mass flow controller, and the hydrogen flow was regulated to combine hydrogen gas with 10% of the oxygen present in the furnace to produce steam in situ. A pyrogenic oxide was grown on the wafer for 45 minutes. Then, the hydrogen and hydrogen chloride flows were turned off and the oxygen flow was continued for 30 minutes. Next the oxygen flow was turned off and nitrogen was injected into the furnace at a rate of about 2 liters/minute. The wafer was slowly pulled from the furnace to room temperature over a period of about 5 minutes. The threshold voltage shift of the N-channel transistors measured under worst case conditions (i.e. $V_{in} = V_{DD} = 10$ volts) was 0.7 volts after the device was exposed to $10^6$ rads (Si) total radiation dose. The integrated circuit continued to meet all type specifications set forth in *RCA High Reliability Devices* 1975 Data Book Series, SSD-207C, pages 456–462, RCA Solid State, 1975. By way of comparison, an RCA type CD4023A integrated circuit manufactured by the standard COS/MOS process will exhibit a 0.7 volt threshold shift of the N-channel transistors after being exposed to only about $10^4$ rads (Si) total dose. The present invention is particularly well adapted for use in commercial manufacturing processes because it provides for a slow pull from the furnace in the presence of an inert gas, such as nitrogen, rather than a quenching step. In addition, the use of the mass flow controller makes the present process particularly well adapted for automated product manufacturing.

We claim:

1. A process for manufacturing oxides for semiconductor devices comprising the steps of:
   (a) placing a silicon wafer into a furnace whose temperature is between 800° C. and 1200° C. and into which only oxygen gas, hydrogen gas and an anhydrous hydrogen halide gas are being injected there being an excess of oxygen gas with respect to hydrogen gas such that between 5% and 95% of the oxygen gas injected into the furnace does not combine with hydrogen gas;
   (b) growing a pyrogenic oxide layer;
   (c) turning off said hydrogen and hydrogen halide flows and growing a dry oxide layer;
   (d) turning off said oxygen flow; and
   (e) injecting an inert gas into said furnace while removing said wafer from said furnace.

2. The process of claim 1 in which said hydrogen halide is selected from the group consisting of hydrogen chloride, hydrogen bromide, and hydrogen iodide.

3. The process of claim 2 wherein said pyrogenic oxide layer is grown for at least 5 minutes.

4. The process of claim 2 wherein said dry oxide layer is grown for at least 5 minutes.

5. The process of claim 2 wherein said silicon wafer has N type conductivity.

6. The process of claim 5 wherein the surface of said crystal is oriented parallel to the (100) crystallographic plane.

7. The process of claim 2 wherein said pyrogenic oxide layer is grown for between 25 minutes and 50 minutes.

8. The process of claim 1 wherein said dry oxide layer is grown for between 25 and 50 minutes.

9. The process of claim 2 wherein the temperature of said furnace is between 850° C. and 1000° C.

10. The process of claim 1 in which said hydrogen halide is selected to be hydrogen chloride.

11. The process of claim 10 wherein said hydrogen chloride concentration is between 0.5% and 3.0% of the volume of said furnace.

12. The process of claim 2 wherein said inert gas is nitrogen.

13. The process of claim 12 wherein said step of removing takes place over a period of about 5 minutes.

14. The process of claim 13 wherein the ambient temperature around said wafer varies from said furnace temperature to about 20° C.

* * * * *

UNITED STATES PATENT AND TRADEMARK OFFICE
CERTIFICATE OF CORRECTION

PATENT NO. : 4,139,658
DATED : February 13, 1979
INVENTOR(S) : Seymour H. Cohen et al.

It is certified that error appears in the above-identified patent and that said Letters Patent is hereby corrected as shown below:

Column 1, line 32, "does" should be --dose--.

Signed and Sealed this

Fifth Day of June 1979

[SEAL]

Attest:

RUTH C. MASON
Attesting Officer

DONALD W. BANNER
Commissioner of Patents and Trademarks